United States Patent
Ogawa et al.

(10) Patent No.: US 7,943,927 B2
(45) Date of Patent: May 17, 2011

(54) ZNO BASED SEMICONDUCTOR LIGHT EMITTING DEVICE AND ITS MANUFACTURE METHOD

(75) Inventors: Akio Ogawa, Yamato (JP); Michihiro Sano, Odawara (JP); Hiroyuki Kato, Yokohama (JP); Hiroshi Kotani, Yokohama (JP); Tomofumi Yamamuro, Kawasaki (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 12/501,764

(22) Filed: Jul. 13, 2009

(65) Prior Publication Data
US 2009/0272972 A1 Nov. 5, 2009

Related U.S. Application Data

(63) Continuation of application No. PCT/JP2008/000019, filed on Jan. 11, 2008.

(30) Foreign Application Priority Data

Jan. 15, 2007 (JP) ................. 2007-005700

(51) Int. Cl.
*H01L 33/00* (2010.01)
(52) U.S. Cl. ............... 257/43; 257/94; 257/12; 257/14; 257/E21.002; 438/47
(58) Field of Classification Search ............. 257/12–15, 257/43, 94, E33.013, E33.048, E21.002
See application file for complete search history.

(56) References Cited

U.S. PATENT DOCUMENTS

| | | | | |
|---|---|---|---|---|
| 6,153,010 A * | 11/2000 | Kiyoku et al. | ................. | 117/95 |
| 6,878,562 B2 * | 4/2005 | Ooi et al. | ................. | 438/22 |
| 2002/0014631 A1 | 2/2002 | Iwata et al. | | |
| 2003/0042851 A1 | 3/2003 | Iwata et al. | | |

FOREIGN PATENT DOCUMENTS

| | | |
|---|---|---|
| AU | 2003-264432 A1 | 5/2004 |
| EP | 1 178 543 A1 | 2/2002 |
| EP | 1 291 930 A2 | 3/2003 |
| JP | 10-270799 A | 10/1998 |
| JP | 11-0238914 A | 8/1999 |
| JP | 2002-016285 A | 1/2002 |
| JP | 2002-118328 A | 4/2002 |
| JP | 2003-081698 A | 3/2003 |
| JP | 2004-128106 A | 4/2004 |
| WO | WO 2004/036659 A1 | 4/2004 |

OTHER PUBLICATIONS

K. Iwata et al., "Bandgap Engineering of ZnO using Se," Phys. Stat. Sol. (B) 229, No. 2, pp. 887-890, 2002. B. K. Meyer., et al., "Structural properties and bandgap bowing of ZnO1-xSx thin films deposited by reactive sputtering," Applied Physics Letters, vol. 85, No. 21, pp. 4921-4931, Nov. 22, 2004.

English Language International Search Report dated Apr. 22, 2008 issued in parent Appln. No. PCT/JP2008/000019.

Written Opinion of the International Searching Authority issued in parent Appln. No. PCT/JP2008/000019 and partial English Translation thereof.

* cited by examiner

*Primary Examiner* — Thinh T Nguyen
(74) *Attorney, Agent, or Firm* — Holtz, Holtz, Goodman & Chick, PC

(57) ABSTRACT

A ZnO based semiconductor light emitting device includes: a first semiconductor layer containing $ZnO_{1-x1}S_{x1}$; a second semiconductor layer formed above the first semiconductor layer and containing $ZnO_{1-x2}S_{x2}$; and a third semiconductor layer formed above the second semiconductor layer and containing $ZnO_{1-x3}S_{x3}$, wherein an S composition x1 of the first semiconductor layer, an S composition x2 of the second semiconductor layer and an S composition x3 of the third semiconductor layer are so selected that an energy of the second semiconductor layer at the lower end of a conduction band becomes lower than both energies of the first and third semiconductor layers at the lower end of the conduction bands, and that an energy of the second semiconductor layer at the upper end of a valence band becomes higher than both energies of the first and third semiconductor layers at the upper end of the valence bands.

10 Claims, 10 Drawing Sheets

| PROCESS CONTENTS | ANNEAL CONDITIONS | S CONCENTRATION ($ZnO_{1-x}S_x$) | RHEED | Ra | BAND GAP ENERGY | IONIZING POTENTIAL |
|---|---|---|---|---|---|---|
| COMPARATIVE EXAMPLE 1 | NO ANNEAL | X = 0 | STREAK PATTERN | 0.65nm | 3.3eV | 5.15eV |
| EMBODIMENT 1 | 500°C 10min | X = 0.1 | STREAK PATTERN | 1.0nm | 2.93eV | 5.3eV |
| COMPARATIVE EXAMPLE 2 | NO ANNEAL | | STREAK PATTERN | 1.09nm | ------ | ------ |
| EMBODIMENT 2 | 500°C 10min | X = 0.15 | STREAK PATTERN | 0.67nm | 2.82eV | 5.3eV |
| COMPARATIVE EXAMPLE 3 | NO ANNEAL | | SPOT PATTERN | 2.06nm | ------ | ------ |
| EMBODIMENT 3 | 700°C 20min | X = 0.25 | STREAK PATTERN | 0.77nm | 2.64eV | 5.15eV |
| COMPARATIVE EXAMPLE 4 | NO ANNEAL | | RING PATTERN | 2.68nm | ------ | ------ |
| EMBODIMENT 4 | 700°C 20min | X = 0.45 | STREAK PATTERN | 0.95nm | 2.5eV | 5.0eV |
| COMPARATIVE EXAMPLE 5 | NO ANNEAL | | RING PATTERN | 2.88nm | ------ | ------ |
| COMPARATIVE EXAMPLE 6 | 300°C 20min | | RING PATTERN | 2.58nm | 2.5eV | ------ |
| EMBODIMENT 5 | 500°C 10min | X = 1 | STREAK PATTERN | 1.0nm | 3.76eV | 4.5eV |

FIG. 2

| PROCESS CONTENTS | ANNEAL CONDITIONS | S CONCENTRATION ($ZnO_{1-x}S_x$) | RHEED | Ra | BAND GAP ENERGY | IONIZING POTENTIAL |
|---|---|---|---|---|---|---|
| COMPARATIVE EXAMPLE 1 | NO ANNEAL | x = 0 | STREAK PATTERN | 0.65nm | 3.3eV | 5.15eV |
| EMBODIMENT 1 | 500°C 10min | x = 0.1 | STREAK PATTERN | 1.0nm | 2.93eV | 5.3eV |
| COMPARATIVE EXAMPLE 2 | NO ANNEAL | | STREAK PATTERN | 1.09nm | ------ | ------ |
| EMBODIMENT 2 | 500°C 10min | x = 0.15 | STREAK PATTERN | 0.67nm | 2.82eV | 5.3eV |
| COMPARATIVE EXAMPLE 3 | NO ANNEAL | | SPOT PATTERN | 2.06nm | ------ | ------ |
| EMBODIMENT 3 | 700°C 20min | x = 0.25 | STREAK PATTERN | 0.77nm | 2.64eV | 5.15eV |
| COMPARATIVE EXAMPLE 4 | NO ANNEAL | | RING PATTERN | 2.68nm | ------ | ------ |
| EMBODIMENT 4 | 700°C 20min | x = 0.45 | STREAK PATTERN | 0.95nm | 2.5eV | 5.0eV |
| COMPARATIVE EXAMPLE 5 | NO ANNEAL | | RING PATTERN | 2.88nm | ------ | ------ |
| COMPARATIVE EXAMPLE 6 | 300°C 20min | | RING PATTERN | 2.58nm | 2.5eV | ------ |
| EMBODIMENT 5 | 500°C 10min | x = 1 | STREAK PATTERN | 1.0nm | 3.76eV | 4.5eV |

US 7,943,927 B2

ZNO BASED SEMICONDUCTOR LIGHT EMITTING DEVICE AND ITS MANUFACTURE METHOD

CROSS REFERENCE TO RELATED APPLICATION

This application is a continuation application of PCT/JP2008/000019, filed on Jan. 11, 2008, the entire contents of which are incorporated herein by reference.

BACKGROUND OF THE INVENTION

A) Field of the Invention

The present invention relates to a ZnO based semiconductor light emitting device and its manufacture method.

B) Description of the Related Art

A transition energy between bands of zinc oxide (ZnO) corresponds to an emission energy in a ultraviolet range of about 370 nm. This wavelength is shorter than a visual light range of 400 nm or longer providing a high industrial usage value. In order to obtain emission at a wavelength longer than 400 nm, studies have been made to narrow a band gap (gap narrowing) of ZnO.

As the gap narrowing techniques of narrowing a band gap of ZnO, ZnCdO mixed crystal replacing a portion of Zn with Cd has been proposed in which the band gap can be adjusted in a range of 3.4 eV to 1.5 eV depending on a composition of Cd. However, since Cd is a highly toxic element, adopting ZnCdO mixed crystal is difficult from the viewpoint of safety.

For example, Japanese Patent Laid-open Publication No. 2002-16285 discloses techniques of gap narrowing of a band gap of ZnO by replacing a portion of O with a group VI element of sulfur (S) or selenium (Se) and forming mixed crystal. The techniques are excellent from the viewpoint of safety, as compared to the techniques of introducing Cd.

Japanese Patent Laid-open Publication No. 2002-16285 also discloses a light emitting device by sandwiching a gap-narrowed ZnO based compound semiconductor layer (ZnOS layer, ZnOSe layer) between ZnMgO clad layers.

According to B. K. Mayer et al: Appl. Phys. Lett. 85 (2004) 4929, a relation between an S composition x and a band gap of $ZnO_{1-x}S_x$ ($0 \leq x \leq 1$) is represented by:

$$E_{ZnOS} = xE_{ZnS} + (1-x)E_{ZnO} - b(1-x)x$$

where $E_{ZnOS}$, $E_{ZnS}$ and $E_{ZnO}$ are band gaps of $ZnO_{1-x}S_x$, ZnS and ZnO, respectively, and b is a bowing parameter. It is said that a band gap of $ZnO_{1-x}S_x$ can be narrowed to 2.6 eV. The bowing parameter b is 3 eV.

Techniques have been desired which can be applied to improving an emission efficiency of a ZnO based semiconductor light emitting device using a $ZnO_{1-x}S_x$ emission layer.

SUMMARY OF THE INVENTION

It is an object of the present invention to provide a ZnO based semiconductor light emitting device with an improved emission efficiency using a $ZnO_{1-x}S_x$ emission layer, and a manufacture method for such a semiconductor light emitting device.

According to one aspect of the present invention, there is provided a ZnO based semiconductor light emitting device including: a first semiconductor layer containing $ZnO_{1-x1}S_{x1}$; a second semiconductor layer formed above the first semiconductor layer and containing $ZnO_{1-x2}S_{x2}$; and a third semiconductor layer formed above the second semiconductor layer and containing $ZnO_{1-x3}S_{x3}$, wherein an S composition x1 of the first semiconductor layer, an S composition x2 of the second semiconductor layer and an S composition x3 of the third semiconductor layer are so selected that an energy of the second semiconductor layer at the lower end of a conduction band becomes lower than both an energy of the first semiconductor layer at the lower end of a conduction band and an energy of the third semiconductor layer at the lower end of a conduction band, and that an energy of the second semiconductor layer at the upper end of a valence band becomes higher than both an energy of the first semiconductor layer at the upper end of a valence band and an energy of the third semiconductor layer at the upper end of a valence band.

According to another aspect of the present invention, there is provided a manufacture method for a ZnO based semiconductor light emitting device including steps of: (a) forming a first semiconductor layer containing $ZnO_{1-x1}S_{x1}$; (b) forming a second semiconductor layer containing $ZnO_{1-x2}S_{x2}$ above the first semiconductor layer; and forming a third semiconductor layer containing $ZnO_{1-x3}S_{x3}$ above the second semiconductor layer, wherein an S composition x1 of the first semiconductor layer, an S composition x2 of the second semiconductor layer and an S composition x3 of the third semiconductor layer are so selected that an energy of the second semiconductor layer at the lower end of a conduction band becomes lower than both an energy of the first semiconductor layer at the lower end of a conduction band and an energy of the third semiconductor layer at the lower end of a conduction band, and that an energy of the second semiconductor layer at the upper end of a valence band becomes higher than both an energy of the first semiconductor layer at the upper end of a valence band and an energy of the third semiconductor layer at the upper end of a valence band.

BRIEF DESCRIPTION OF THE DRAWINGS

FIG. 2 is a table showing a list of results of first to fifth embodiments and first to sixth comparative examples.

DESCRIPTION OF THE PREFERRED EMBODIMENTS

Figure 1:
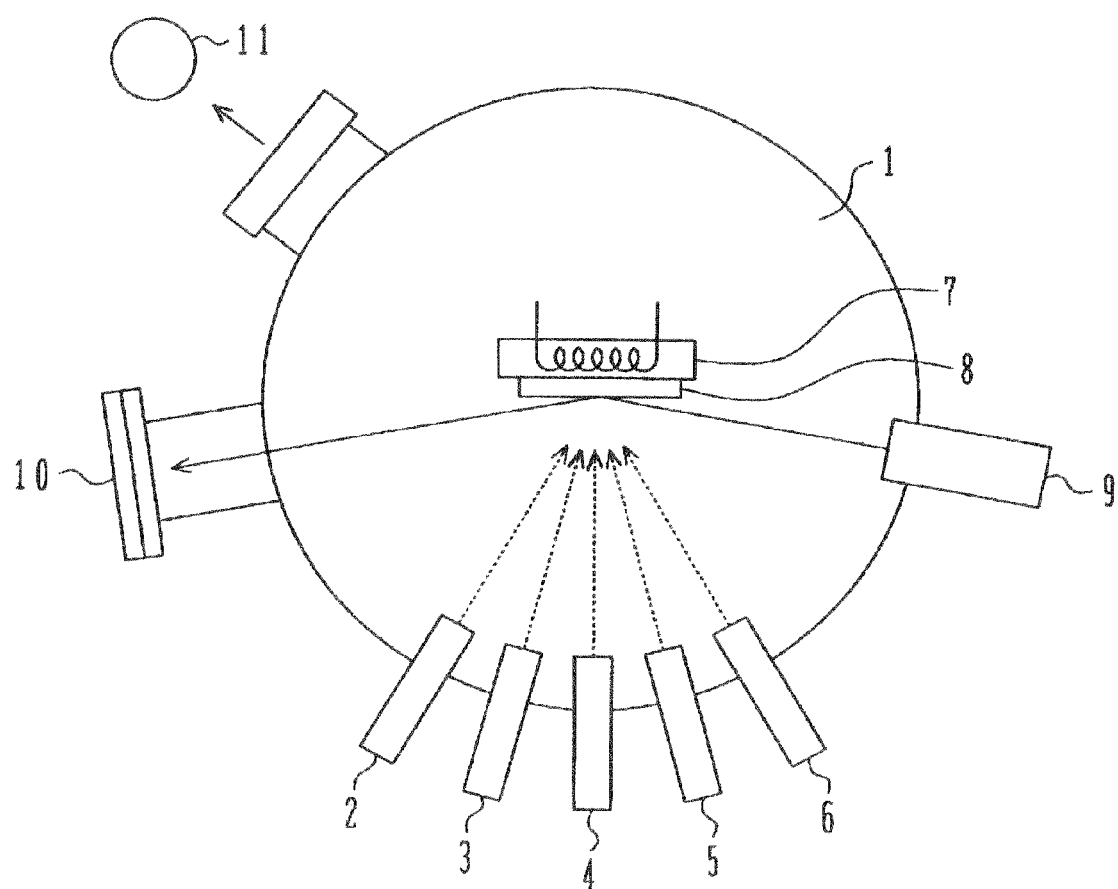
FIG. 1 is a schematic diagram illustrating an example of a film forming system (crystal manufacture system) for growing a ZnO based compound semiconductor layer.

First, with reference to FIG. 1, description will be made on an example of a film forming system (crystal manufacture system) for growing a ZnO based compound semiconductor layer. As a film forming method, molecular beam epitaxy (MBE) is used. A ZnO based semiconductor contains at least Zn and O.

A substrate heater 7 is disposed in an ultra high vacuum chamber 1, and a substrate 8 is held by the substrate heater 7. The substrate 8 may be a sapphire ($Al_2O_3$) substrate, an SiC substrate, a GaN substrate, a ZnO substrate or the like. In order to obtain a ZnO based compound semiconductor layer having good crystallinity, the smaller lattice mismatch is, the better the substrate is. It is therefore best to use a ZnO substrate.

The ultra high vacuum chamber 1 is equipped with a Zn source gun 2, an O source gun 3, a ZnS source gun 4, an N source gun 5 and a Ga source gun 6. The Zn source gun 2, ZnS source gun 4 and Ga source gun 6 have Knudsen cells for accommodating solid sources Zn, ZnS and Ga, and emit a Zn beam, a ZnS beam and a Ga beam, respectively.

Instead of the ZnS source gun, an S source gun using a single body S as the solid source may be used. Other sulfur compounds such as $H_2S$ may be used as a sulfur source.

The O source gun 3 and N source gun 5 have electrodeless discharge tubes at a high frequency (e.g., 13.56 MHz). The O source gun 3 and N source gun 5 make radicals of oxygen gas and nitrogen gas in the electrodeless discharge tubes, and emit an O radical beam and an N radical beam. As beams of desired species are supplied to the substrate 8 at a desired timing, a ZnO based compound semiconductor layer having a desired composition can be grown.

A reflection high energy electron diffraction (RHEED) gun 9 and a screen 10 on which an RHEED image is displayed are mounted on the ultrahigh vacuum chamber 1. Crystallinity of a ZnO based compound semiconductor layer formed on the substrate 8 can be evaluated from an RHEED image. If a ZnO base compound semiconductor layer is made of single crystal having a flat surface (two-dimensionally grown), an RHEED image has a streak pattern, whereas if the layer is made of single crystal not having a flat surface (three-dimensionally grown), an RHEED image has a spot pattern. If a ZnO based compound semiconductor is polycrystal, an RHEED image has a ring pattern.

A vacuum pump 11 evacuates the inside of the ultra high vacuum chamber 1. A ultra high vacuum is a vacuum at a pressure of $1 \times 10^{-7}$ Torr.

Next, description will be made on $ZnO_{1-x}S_x$ single layer forming methods according to the first to fifth embodiments and the first to sixth comparative examples. S compositions x were changed in various ways for the embodiments and comparative examples.

First, the first comparative example will be described. In the first comparative example, a ZnO layer not containing S (i.e., a $ZnO_{1-x}S_x$ layer at x=0) was formed. First, a washed c-plane ZnO substrate was held by a substrate heater of the film forming system to expose a + c-plane, and thermal annealing was performed to further clean the substrate surface. The thermal annealing was performed for 30 minutes at 900° C. at a high vacuum of $1 \times 10^{-9}$ Torr.

Next, a Zn beam and O radical beam were applied at the same time to the + c-plane of the ZnO substrate to form a ZnO layer. A substrate temperature was set to 700° C. The Zn beam was applied at a beam amount of $2.0 \times 10^{-7}$ Torr (a pressure in the ultra high vacuum chamber) by using a Zn solid source having a purity of 7N. The O radical beam was applied at a beam amount of $3 \times 10^{-5}$ Torr, by introducing 1 sccm of pure oxygen gas having a purity of 6N to form plasma.

With this method, samples of two types were formed including a sample (a thick sample) grown to a thickness of about 1 μm and a sample (a thin sample) grown to a thickness of about 100 nm.

For the thick sample, a composition was analyzed by energy dispersion x-ray spectroscopy (EDX), and a band gap was measured. A band gap energy was obtained through absorption coefficient measurements. For the thin sample, a surface roughness (arithmetic average roughness Ra) was measured with an atomic force microscope (AFM), an ionizing potential was measured, and RHEED measurements were made during growth. For ionizing potential measurements, photoelectron spectroscopy in air was used. If a surface roughness Ra is 1.1 nm or smaller, the surface is evaluated as a flat surface. [0025]

Grown ZnO crystal was transparent, and a film having good flatness was formed.

Evaluation results by the above-described method indicated that the ZnO layer of the first comparative example did not contain S, a band gap energy was 3.3 eV, a surface roughness Ra was 0.65 nm, and an ionizing potential was 5.15 eV.

Next, the first embodiment will be described. A Zn beam, an O radical beam and a ZnS beam were applied at the same time to the + c-plane of a ZnO substrate subjected to thermal annealing by a method similar to the first comparative example to form a $ZnO_{1-x}S_x$ layer. A substrate temperature was set to 400° C. The Zn beam and O radical beam were applied under the conditions similar to the first comparative example. The ZnS beam was applied at a beam amount of $2.0 \times 10^{-7}$ Torr using a solid source of ZnS single crystal having a purity of 5N. After the $ZnO_{1-x}S_x$ was formed, annealing was performed for 10 minutes at 500° C.

With this method, samples of two types were formed including a sample (a thick sample) grown to a thickness of about 1 μm and a sample (a thin sample) grown to a thickness of about 100 nm. Similar to the first comparative example, for the thick sample, a composition was analyzed by EDX, and a band gap was measured. For the thin sample, a surface roughness was measured with AFM, an ionizing potential was measured, and RHEED measurements were made during growth.

Grown $ZnO_{1-x}S_x$ crystal was very thin and transparent in very dilute yellow, and a film having good flatness was formed.

Evaluation results by the above-described method indicated that the $ZnO_{1-x}S_x$ layer of the first embodiment had an S composition x of 0.1, a band gap energy was 2.93 eV, a surface roughness Ra was 1.0 nm, and an ionizing potential was 5.3 eV. An RHEED image of the $ZnO_{1-x}S_x$ layer of the thin sample had a streak pattern. The $ZnO_{1-x}S_x$ layer having good crystallinity and flatness was obtained.

Next, the second comparative example will be described. A $ZnO_{1-x}S_x$ layer was grown to a thickness of 100 nm by the method similar to the first embodiment. As different from the first embodiment, annealing was not performed after the film was formed.

A surface roughness was measured with AFM, and RHEED measurements were conducted during growth. The $ZnO_{1-x}S_x$ layer of the second comparative example had a surface roughness Ra of 1.09 nm, and the RHEED image indicated a streak pattern. Since an S concentration is low, it can be considered that a film having relatively good crystallinity and flatness was formed without annealing.

Next, the second embodiment will be described. Samples (thick and thin samples) were formed by the method similar to the first embodiment, excepting that a beam amount of the ZnS beam was set to $4.0\times10^{-7}$ Torr. Grown $ZnO_{1-x}S_x$ crystal was transparent in dilute yellow, and a film having good flatness was formed.

Similar to the first embodiment, the composition and the like were evaluated. The $ZnO_{1-x}S_x$ layer of the second embodiment had an S composition x of 0.15, a band gap energy of 2.82 eV, a surface roughness Ra of 0.67 nm and an ionizing potential of 5.3 eV. An RHEED image of the $ZnO_{1-x}S_x$ layer of the thin sample after annealing had a streak pattern. A $ZnO_{1-x}S_x$ layer having good crystallinity and flatness was obtained.

Next, the third comparative example will be described. A $ZnO_{1-x}S_x$ layer was grown to a thickness of 100 nm by a method similar to the second embodiment. As different from the second embodiment, however, annealing after the layer was formed was not performed.

A surface roughness was measured with AFM, and RHEED measurements were conducted during growth. The $ZnO_{1-x}S_x$ layer of the third comparative example had a surface roughness Ra of 2.06 nm, an RHEED image indicated a spot pattern. As compared to two-dimensional growth (corresponding to an RHEED image of the streak pattern), it is considered that three-dimensional growth (corresponding to an RHEED image of the spot pattern) is easier without reducing dislocations, so that crystallinity is judged relatively bad.

Next, the third embodiment will be described. Samples (thick and thin samples) were formed by the method similar to the first embodiment, excepting that a beam amount of the Zn beam was set to $3\times10^{-7}$ Torr, a beam amount of the ZnS beam was set to $4.0\times10^{-7}$ Torr, and annealing after the layer was formed was performed for 20 minutes at 700° C. Grown $ZnO_{1-x}S_x$ crystal was transparent in yellow, and a film having good flatness was formed.

Similar to the first embodiment, the composition and the like were evaluated. The $ZnO_{1-x}S_x$ layer of the third embodiment had an S composition x of 0.25, a band gap energy of 2.64 eV, a surface roughness Ra of 0.77 nm and an ionizing potential of 5.15 eV. An RHEED image of the $ZnO_{1-x}S_x$ layer of the thin sample after annealing had a streak pattern. A $ZnO_{1-x}S_x$ layer having good crystallinity and flatness was obtained.

Next, the fourth comparative example will be described. A $ZnO_{1-x}S_x$ layer was grown to a thickness of 100 nm by a method similar to the third embodiment. As different from the third embodiment, however, annealing after the layer was formed was not performed.

A surface roughness was measured with AFM, and RHEED measurements were conducted during growth. The $ZnO_{1-x}S_x$ layer of the fourth comparative example had a surface roughness Ra of 2.68 nm, an RHEED image indicated a ring pattern, and crystallinity and flatness were bad.

Next, the fourth embodiment will be described. Samples (thick and thin samples) were formed by the method similar to the first embodiment, excepting that a beam amount of the Zn beam was set to $3\times10^{-7}$ Torr, a beam amount of the ZnS beam was set to $4.0\times10^{-7}$ Torr, and annealing after the layer was formed was performed for 20 minutes at 700° C. Grown $ZnO_{1-x}S_x$ crystal was transparent in yellowish brown, and a film having good flatness was formed.

Similar to the first embodiment, the composition and the like were evaluated. The $ZnO_{1-x}S_x$ layer of the fourth embodiment had an S composition x of 0.45, a band gap energy of 2.5 eV, a surface roughness Ra of 0.95 nm and an ionizing potential of 5.0 eV. An RHEED image of the $ZnO_{1-x}S_x$ layer of the thin sample after annealing had a streak pattern. A $ZnO_{1-x}S_x$ layer having good crystallinity and flatness was obtained.

Next, the fifth comparative example will be described A $ZnO_{1-x}S_x$ layer was grown to a thickness of 100 nm by a method similar to the fourth embodiment. As different from the fourth embodiment, however annealing after the layer was formed was not performed.

A surface roughness was measured with AFM, and RHEED measurements were conducted during growth. The $ZnO_{1-x}S_x$ layer of the fifth comparative example had a surface roughness Ra of 2.88 nm, an RHEED image indicated a ring pattern, and crystallinity and flatness were bad.

Next, the sixth comparative example will be described. The sixth comparative example is similar to the fourth embodiment excepting that a temperature of annealing after the layer was formed was set to 300° C. Grown $ZnO_{1-x}S_x$ crystal was transparent in yellowish brown.

Similar to the first embodiment, the composition and the like were evaluated. Similar to the fourth embodiment, the $ZnO_{1-x}S_x$ layer of the sixth comparative example had an S composition x of 0.45, and a band gap energy of 2.5 eV. However, a surface roughness Ra was 2.58, an RHEED image after annealing indicated a ring pattern, and crystallinity and flatness were bad.

Next, the fifth embodiment will be described. In the fifth embodiment, a ZnS layer (i.e., a $ZnO_{1-x}S_x$ layer at x=1) was formed. A ZnS beam was applied to the + c-plane of a ZnO substrate subjected to thermal annealing by a method similar to the first comparative example to form a ZnS layer. A substrate temperature was set to 300° C. The ZnS beam was applied at a beam amount of $2.0\times10^{-7}$ Torr (a pressure in the ultra high vacuum chamber) using a solid source of ZnS having a purity of 5N. After the ZnS beam was applied, annealing was performed for 10 minutes at 500° C. Similar to the first embodiment, thick and thin samples were formed. Grown ZnS crystal was transparent in white, and a film having good flatness was formed.

Similar to the first embodiment, the composition and the like were evaluated. The ZnS layer of the fifth embodiment had a band gap energy of 3.76 eV, a surface roughness Ra of 1.00 nm and an ionizing potential of 4.5 eV. An RHEED image of the ZnOS layer of the thin sample after annealing had a streak pattern. A ZnOS layer having good crystallinity and flatness was obtained.

Figure 3A:
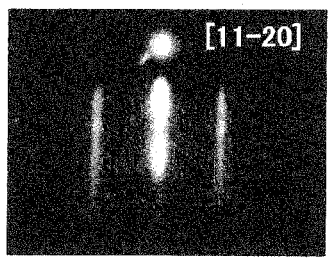
FIGS. 3A to 3C are RHEED images of the first embodiment, and the third and fourth comparative examples.
Figure 3B:
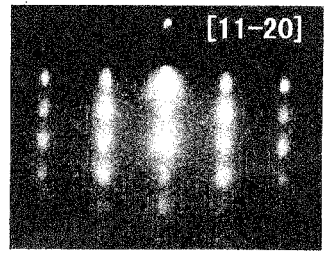
Figure 3C:
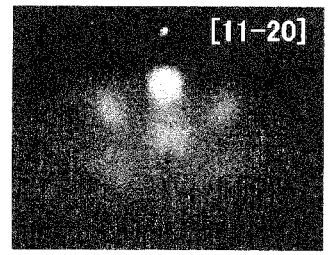

The results of the first to fifth embodiments and the first to sixth comparative examples are listed in the table illustrated in FIG. 2. FIGS. 3A to 3C illustrate RHEED images of the first embodiment and the third and fourth comparative examples. An RHEED image of the first embodiment indicates a streak pattern, an RHEED image of the third comparative example indicates a spot pattern, and an RHEED image of the fourth comparative example indicates a ring pattern.

Figure 4:
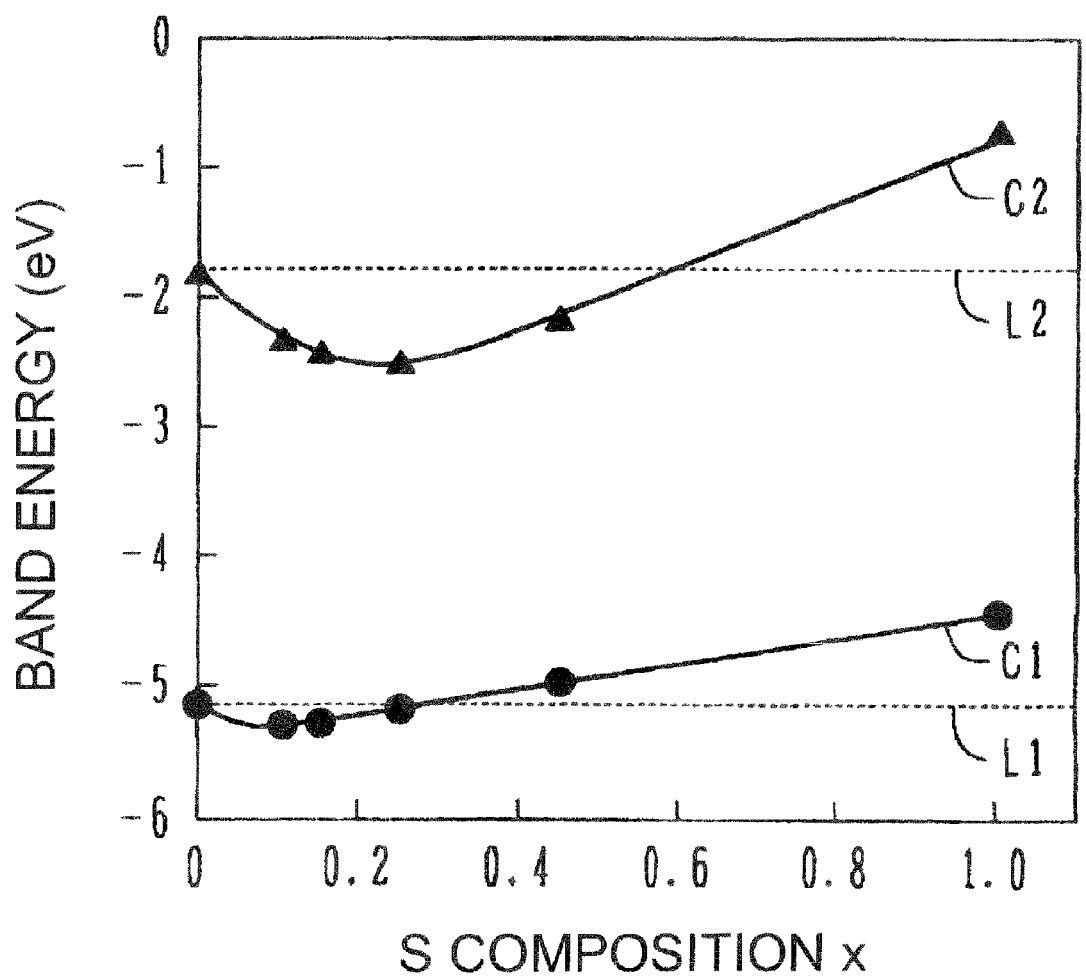
FIG. 4 illustrates band lineups of $ZnO_{1-x}S_x$ and ZnO obtained from the results of the first comparative example and the first to fifth embodiments.

FIG. 4 illustrates band lineups of $ZnO_{1-x}S_x$ and ZnO obtained from the results of the first comparative example and the first to fifth embodiments. The abscissa represents an S composition x, and the ordinate represents a band energy (energy relative to an electron) in the unit of eV.

A dotted line L1 indicates an energy of ZnO at the upper end of a valence band, and a dotted line L2 indicates an energy of ZnO at the lower end of the conduction band. A curve C1 indicates an energy of $ZnO_{1-x}S_x$ at the upper end of a valence band, and a curve C2 indicates an energy of $ZnO_{1-x}S_x$ at the lower end of the conduction band.

The energy at the upper end of the valence band corresponds to an ionizing potential, and the energy at the lower end of the conduction band corresponds to a value of the ionizing potential subtracted by a band gap energy.

In a range of the S composition x of 0<x<0.6, the energy of $ZnO_{1-x}S_x$ at the lower end of the conduction band is lower than the energy of ZnO at the lower end of the conduction band. Therefore, in the range of the S composition x of $0<x<0.6$, electrons in the structure that the $ZnO_{1-x}S_x$ layer is sandwiched between ZnO layers can be confined in the $ZnO_{1-x}S_x$ layer.

In a range of the S composition x of $0.25<x\leqq1$, the energy of $ZnO_{1-x}S_x$ at the upper end of the valence band is higher than the energy of ZnO at the upper end of the valence band. Therefore, in the range of the S composition x of $0.25<x\leqq1$, holes in the structure that the $ZnO_{1-x}S_x$ layer is sandwiched between ZnO layers can be confined in the $ZnO_{1-x}S_x$ layer.

Figure 5:
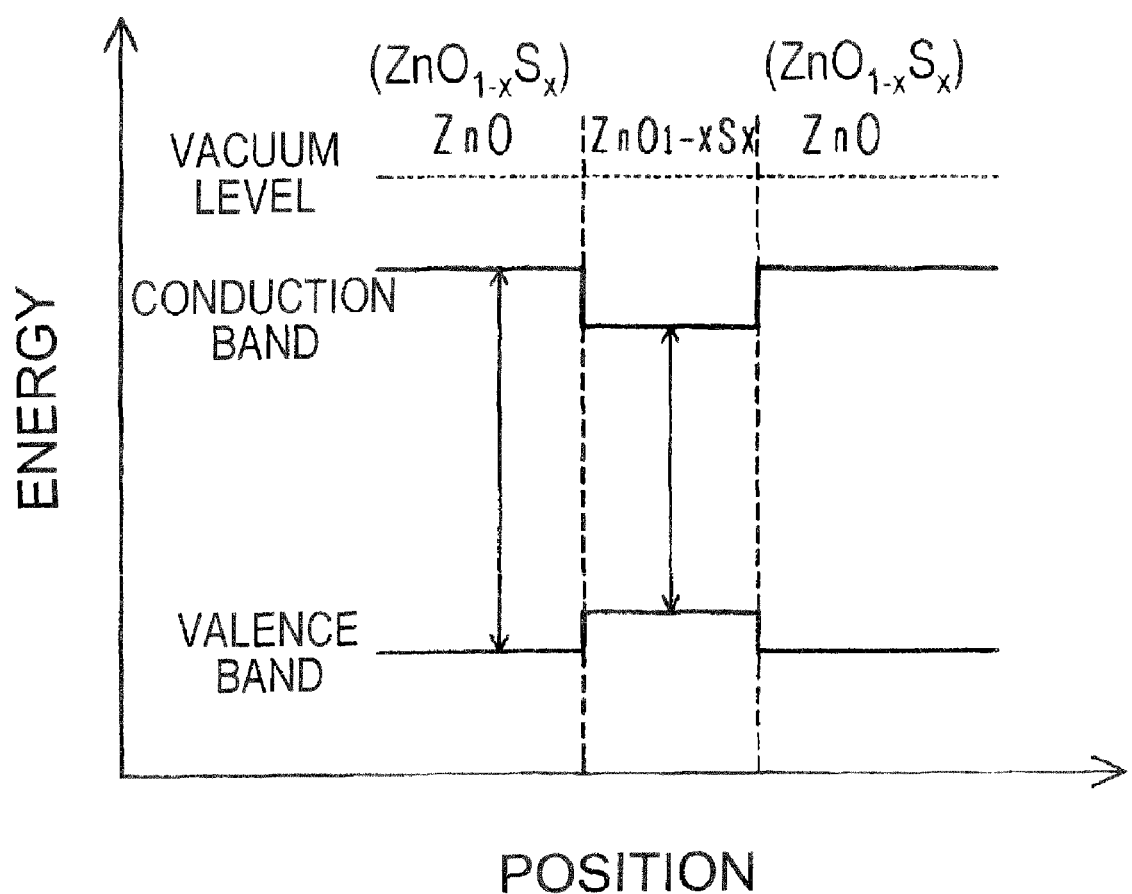
FIG. 5 is a band diagram of a type I structure sandwiching the $ZnO_{1-x}S_x$ layer between ZnO ($ZnO_{1-x}S_x$) layers.

Therefore, in a range of the S composition x of $0.25<x<0.6$, a band diagram of the structure that the $ZnO_{1-x}S_x$ layer is sandwiched between ZnO layers becomes the type I as illustrated in FIG. 5, and carriers (electrons or holes) can be confined in the $ZnO_{1-x}S_x$ layer. From the viewpoint of electron confinement and film forming feasibility, it is preferable to lower the S composition x slightly, e.g., $0.25<x\leqq0.5$.

Next, by generalizing the above-described studies, a band diagram of the structure that three $ZnO_{1-x}S_x$ layers are stacked will be studied. It is assumed that a second $ZnO_{1-x}S_x$ layer is sandwiched between first and third $ZnO_{1-x}S_x$ layers. S compositions of the first to third $ZnO_{1-x}S_x$ layers are represented by x1 to x3, respectively. As illustrated in the band lineups of FIG. 4, the S compositions x1 to x3 of the first to third $ZnO_{1-x}S_x$ layers correspond to the energy of each $ZnO_{1-x}S_x$ layer at the lower end of the conduction band and the energy of each $ZnO_{1-x}S_x$ layer at the upper end of the valence band.

According to the band lineups illustrated in FIG. 4, the S compositions x1 to x3 of the first to third $ZnO_{1-x}S_x$ layers can be selected so that the energy of the second $ZnO_{1-x}S_x$ layer at the lower end of the conduction band becomes lower than both the energy of the first $ZnO_{1-x}S_x$ layer at the lower end of the conduction band and the energy of the third $ZnO_{1-x}S_x$ layer at the lower end of the conduction band, and so that the energy of the second $ZnO_{1-x}S_x$ layer at the upper end of the valence band becomes higher than both the energy of the first $ZnO_{1-x}S_x$ layer at the upper end of the valence band and the energy of the third $ZnO_{1-x}S_x$ layer at the upper end of the valence band. Namely, a band diagram of the structure that the second $ZnO_{1-x}S_x$ layer is sandwiched between the first and third $ZnO_{1-x}S_x$ layers can take the type I.

It is possible to make the S compositions x1 and x3 of the first and third $ZnO_{1-x}S_x$ layers different. Ranges of the S compositions x1 and x3 of the first and third $ZnO_{1-x}S_x$ layers may be $0\leqq x1<0.25$ and $0\leqq x3<0.25$, respectively. A range of the S composition of the second $ZnO_{1-x}S_x$ layer is determined in accordance with the S compositions x1 and x3 of the first and third $ZnO_{1-x}S_x$ layers.

For example, in the structure that ZnOS mixed crystal is sandwiched between ZnO layers, the S compositions x1 and x3 of the first and third $ZnO_{1-x}S_x$ layers are both 0, and a range of the S composition x2 of the second $ZnO_{1-x}S_x$ layer is $0.25<x2<0.6$ as described above.

Figure 6:
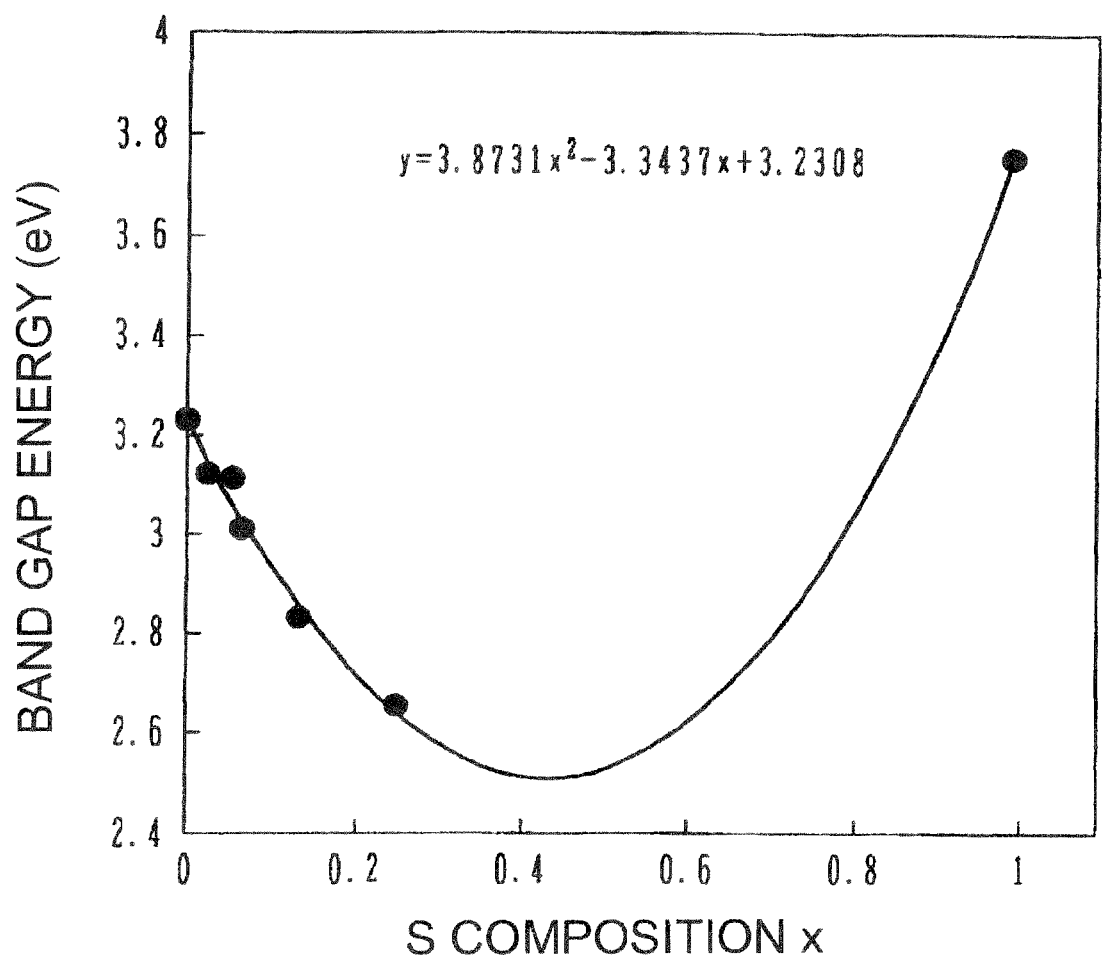
FIG. 6 is a graph illustrating a dependency of a band gap energy of $ZnO_{1-x}S_x$ upon an S composition x.

FIG. 6 is a graph illustrating a dependency of a band gap energy of $ZnO_{1-x}S_x$ upon the S composition x. The abscissa represents an S composition x, and the ordinate represents a band gap energy in the unit of eV. The band gap energy is fitted by $y=3.873x^2-3.3437x+3.2308$ where x is the S composition.

By controlling a range of the S composition x to be $0.25<x<0.6$, the band gap energy can be controlled to be in a range of 2.5 eV to 2.65 eV. At the S composition x of near 0.4, the band gap energy takes a minimum value of 2.5 eV. An emission wavelength corresponding to the band gap energy of 2.5 eV to 2.65 eV is blue to bluish green at 468 nm to 496 nm.

Although measurements for the band gap energy made for the graph in FIG. 6 is different from the measurements made for the first comparative example and the first to fifth embodiments, both the measurements fit together. For example, in the fourth embodiment, a band gap energy of 2.5 eV is obtained at an S composition x of 0.45.

In the first to fifth embodiments, even at a high S concentration, a $ZnO_{1-x}S_x$ layer having good flatness was obtained by performing annealing after the $ZnO_{1-x}S_x$ layer was formed. A surface roughness Ra measured with AFM was able to be set to, e.g., 1 nm or smaller.

In the second to fifth comparative examples not performing annealing after the $ZnO_{1-x}S_x$ layer was formed, although a $ZnO_{1-x}S_x$ layer having good flatness was obtained for the second comparative example at a low S concentration, only $ZnO_{1-x}S_x$ layers having bad flatness were obtained at a higher S concentration.

It is considered that if a film forming temperature of a $ZnO_{1-x}S_x$ layer is too high, it becomes difficult to raise an S concentration because an S vapor pressure is very high as compared to that of ZnO. In order to introduce S properly, it is preferable to lower sufficiently a film forming temperature. In the above-described embodiments, the film forming temperature was set to 400° C. or 300°. The film forming temperature was lowered as the S concentration became high. It is expected that a film forming temperature of the $ZnO_{1-x}S_x$ layer is preferably lower than 500° C.

It is however considered that as the film forming temperature is set lower than 500° C., atoms are difficult to be migrated in the $ZnO_{1-x}S_x$ layer during growth and a flat film is difficult to be formed. Flatness of the $ZnO_{1-x}S_x$ layer can be improved by performing annealing after the $ZnO_{1-x}S_x$ layer is formed.

A sixth comparative example had the same S composition x (x=0.45) as that of the fourth embodiment, and annealing was performed after the $ZnO_{1-x}S_x$ layer was formed, similar to the fourth embodiment. Although the flat $ZnO_{1-x}S_x$ layer of the fourth embodiment was obtained at an annealing temperature of 700° C., a flat $ZnO_{1-x}S_x$ layer was not obtained at an annealing temperature of 300° C. of the sixth comparative example.

It is considered that as the annealing temperature is set to 500° C. or higher, atoms become easy to be migrated in the $ZnO_{1-x}S_x$ layer and planarization progresses. However, if the annealing temperature is set to 1000° C. or higher, it is considered that the $ZnO_{1-x}S_x$ layer is evaporated again and crystallinity and flatness are degraded. It is expected that an annealing temperature is preferably set to 500° C. or higher, and lower than 1000° C.

Next, description will be made on a method of forming a multiple quantum well (MQW) structure of the sixth embodiment and a seventh comparative example. First, the sixth embodiment will be described. A washed c-plane ZnO substrate was held by a substrate heater of the film forming system to expose a + c-plane, and thermal annealing was performed to further clean the substrate surface. The thermal annealing was performed for 30 minutes at 900° C. at a high vacuum of $1\times10^{-9}$ Torr.

Next, a Zn beam and O radical beam were applied at the same time to the + c-plane of the ZnO substrate to form a ZnO barrier layer. A substrate temperature was set to 400° C. The Zn beam was applied at a beam amount of $2.0\times10^{-7}$ Torr by using a Zn solid source having a purity of 7N. The O radical beam was applied at a beam amount of $3\times10^{-5}$ Torr, by introducing 1 sccm of pure oxygen gas having a purity of 6N to form plasma. A thickness of the ZnO barrier layer was set to 20 nm.

Next, a Zn beam, O radical beam and ZnS beam were applied at the same time to the ZnO barrier layer to form a $ZnO_{1-x}S_x$ well layer (x=0.28). A substrate temperature was set to 400° C. The Zn beam was applied at a beam amount of $3.0\times10^{-7}$ Torr by using a Zn solid source having a purity of 7N. The O radical beam was applied at a beam amount of $3\times10^{-5}$ Torr, by introducing 1 sccm of pure oxygen gas having a purity of 6N to form plasma. The ZnS beam was applied at a beam amount $5.0\times10^{-7}$ Torr by using a ZnS single crystal solid source having a purity of 5N. A thickness of the $ZnO_{1-x}S_x$ well layer was set to 5 nm.

After the $ZnO_{1-x}S_x$ (x=0.28) well layer is formed, the substrate was heated to 800° C. higher than a film forming temperature (400° C.) for the barrier layer and well layer. The temperature was maintained at 800° C., and annealing was performed for 5 minutes.

Thereafter, a set of the barrier layer forming process, well layer forming process and annealing process was repeated under the above-described conditions to form a $ZnO_{1-x}S_x$ (x=0.28)/ZnO MQW structure of five cycles.

Next, the seventh comparative example will be described. The seventh comparative example omits the annealing process of the sixth embodiment. Namely, a $ZnO_{1-x}S_x$ (x=0.28)/ZnO MQW structure of five cycles was formed without performing annealing after the $ZnO_{1-x}S_x$ (x=0.28) well layer was formed.

Next, description will be made on results of 2θ-ω measurements of x-ray diffraction (XRD) of the $ZnO_{1-x}S_x$ (x=0.28)/ZnO MQW structures of the sixth embodiment and seventh comparative example.

If an interface between the ZnO barrier layer and $ZnO_{1-x}S_x$ well layer is flat, a diffraction peak corresponding to a thickness of one cycle of the MQW structure (a thickness of a lamination of one barrier layer and one well layer) is observed in a diffraction pattern of 2θ-ω measurements because of reflection of a refractive index difference between the ZnO barrier layer and $ZnO_{1-x}S_x$ well layer. This diffraction peak is called a satellite peak. The larger the number of orders of the satellite peak, it is judged than the interface flatness is better.

Figure 7:
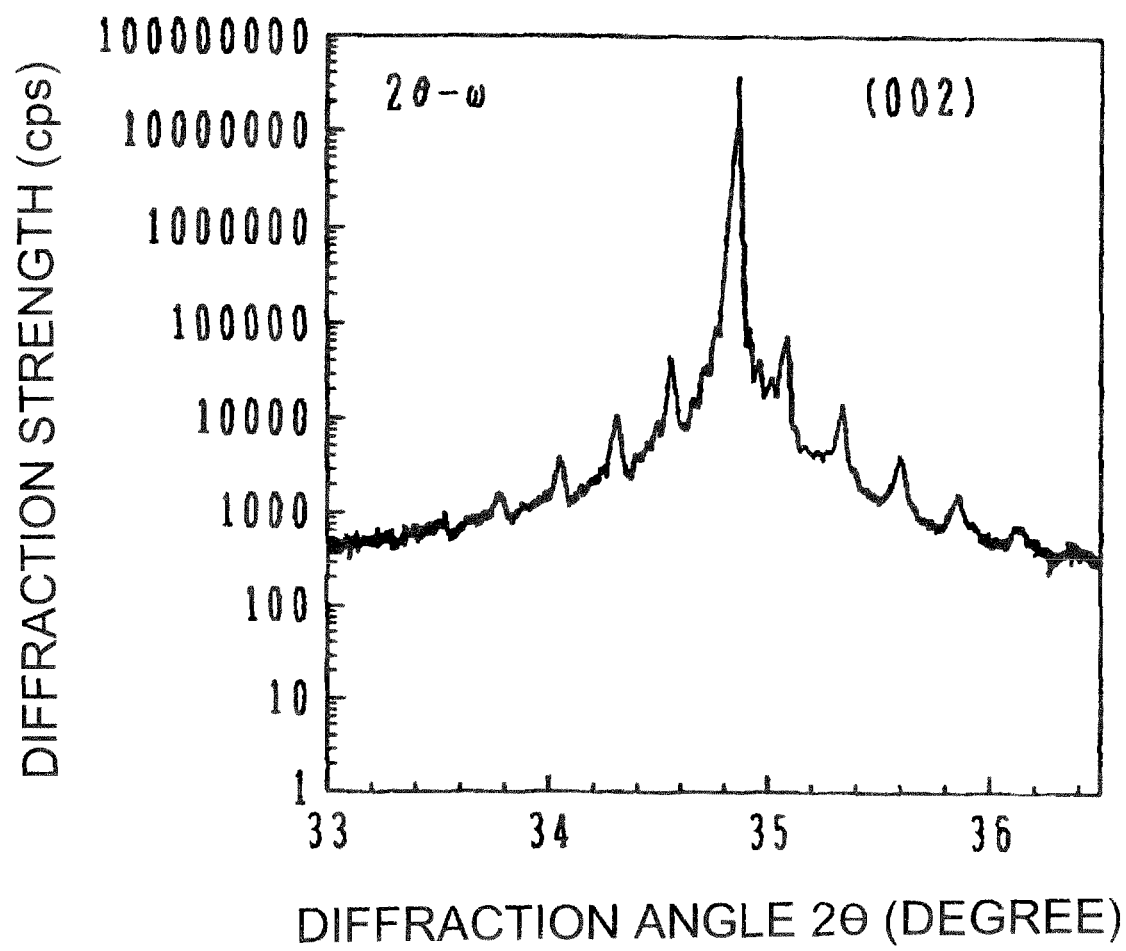
FIG. 7 is a diffraction pattern of a MQW structure of the sixth embodiment obtained through 2θ-ω measurements of XRD.
Figure 8:
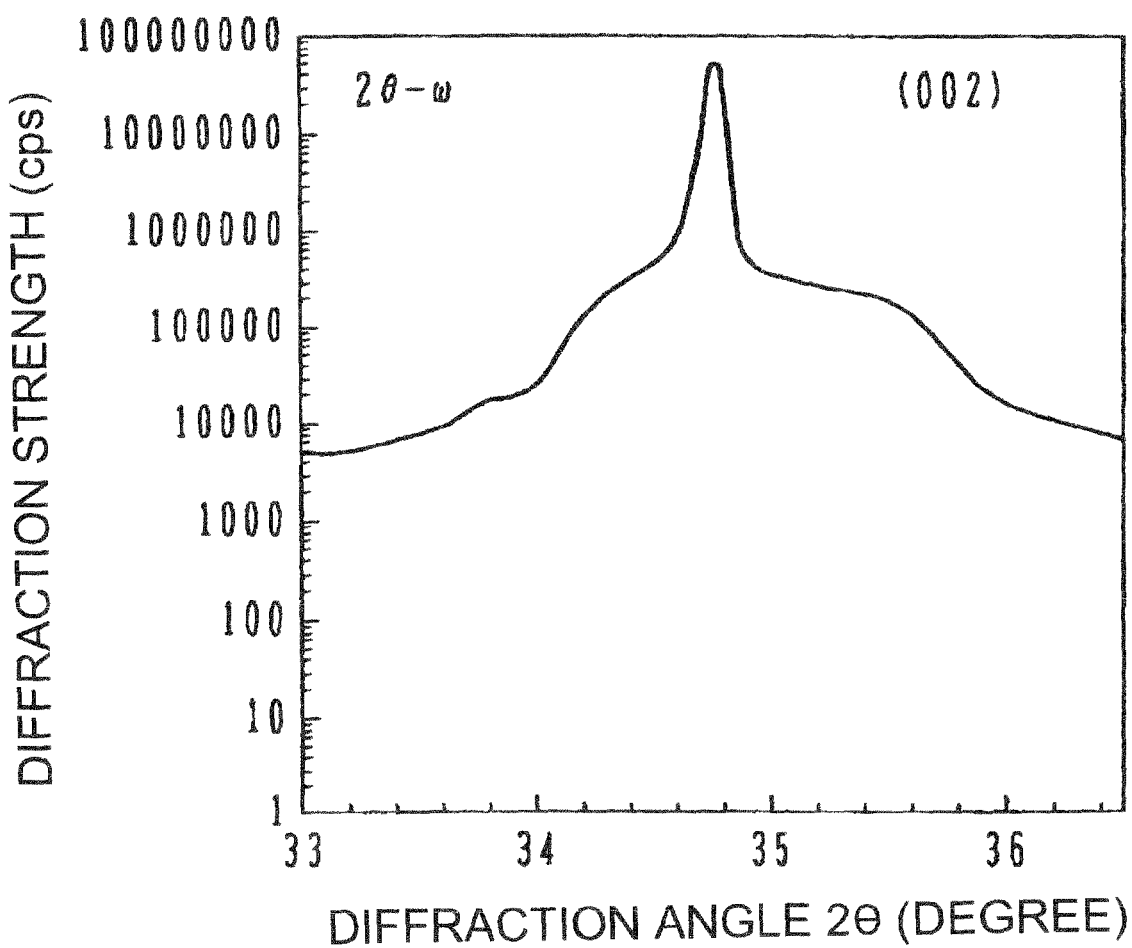
FIG. 8 is a diffraction pattern of a MQW structure of a seventh comparative example obtained through 2θ-ω measurements of XRD.

FIGS. 7 and 8 illustrate diffraction patterns of the sixth embodiment and seventh comparative example. The abscissa of each graph represents a diffraction angle 2θ in the unit of degree, and the ordinate represents a diffraction strength at a log scale in the unit of counts/second (cps). The 2θ-ω measurements were conducted on the (002) plane.

It is surprising that the satellite peak is observed to the fifth order in the diffraction pattern of the sixth embodiment, and the interface between the barrier layer and well layer is very flat. On the other hand, a clear satellite peak is not observed in the seventh comparative example, and the interface between the barrier layer and well layer is not so flat. It is considered that there is film thickness irregularity in the comparative example. By performing annealing after the $ZnO_{1-x}S_x$ well layer is formed as in the embodiment, a MQW structure having high flatness of the interface between the barrier layer and well layer (having high uniformity of a film thickness) can be obtained.

Figure 9A:
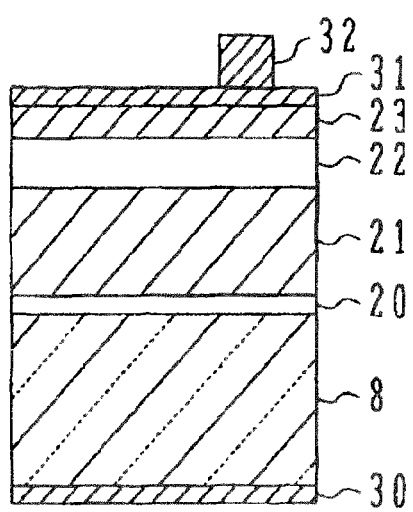
FIG. 9A is a schematic cross sectional view of a light emitting device of a seventh embodiment.

Next, with reference to FIGS. 9A to 9C, description will be made on a manufacture method for a ZnO based light emitting diode of the seventh embodiment. A c-plane ZnO substrate having an n-type conductivity is used as a substrate 8. First, the sixth embodiment will be described. A washed substrate 8 is held by a substrate heater of the film forming system to expose a + c-plane, and thermal annealing is performed for 30 minutes at 900° C. to further clean the substrate surface.

Next, an n-type ZnO buffer layer 20 is formed on the thermally annealed substrate 8. The n-type ZnO buffer layer 20 is formed by applying a Zn beam and O radical beam at the same time to the substrate heated to 300° C. to 500° C., and performing annealing for about 30 minutes at 800° C. to 900° C. A thickness of the n-type ZnO buffer layer 20 is preferably about 10 nm to 30 nm. It is considered that the n-type conductivity is obtained because O atoms escape from the n-type ZnO buffer layer 20 during annealing.

Next, an n-type ZnO layer 21 doped with Ga is formed on the n-type ZnO buffer layer 20. The n-type ZnO layer 21 is grown by applying a Zn beam, O radical beam and Ga beam at the same time to the substrate heated to 500° C. to 1000° C. A thickness of the n-type ZnO layer 21 is preferably 1 μm to 2 μm, and a Ga concentration is preferably $1\times10^{18}$ $cm^{-3}$ or larger.

Next, an emission layer 22 is formed on the n-type ZnO layer 21. The emission layer 22 has a quantum well structure having a $ZnO_{1-x}S_x$ (0.25<x<0.6) layer as a well layer and a ZnO layer as a barrier layer.

The $ZnO_{1-x}S_x$ (0.25<x<0.6) well layer is grown by applying a Zn beam, O radical beam and ZnS beam at the same time to the substrate heated to a temperature lower than 500° C. After the $ZnO_{1-x}S_x$ (0.25<x<0.6) well layer is grown, annealing is performed by raising a substrate temperature to 500° C. or higher, and lower than 1000° C. The ZnO barrier layer is grown by applying a Zn beam and O radical beam at the same time to the substrate heated to 500° C. or higher, and lower than 1000° C.

Figure 9B:
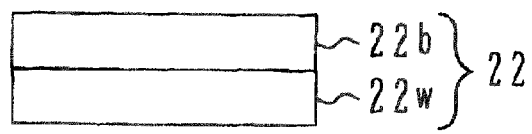
FIGS. 9B and 9C are schematic cross sectional views illustrating examples of the structure of a light emitting device.
Figure 9C:
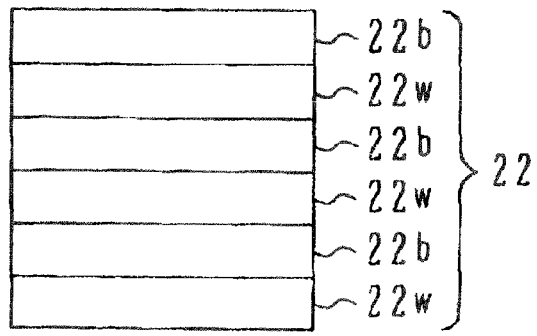

As illustrated in FIG. 9B, the emission layer 22 may have a structure of a $ZnO_{1-x}S_x$ (0.25<x<0.6) well layer 22w and a ZnO barrier layer 22b laminated by one cycle. As illustrated in FIG. 9C, the emission layer may have a multiple quantum well structure of a $ZnO_{1-x}S_x$ (0.25<x<0.6) well layer 22w and a ZnO barrier layer 22b laminated by a plurality of cycles. The uppermost ZnO barrier layer may not be formed (because a ZnO layer is later formed above the emission layer).

The emission layer may be a single $ZnO_{1-x}S_x$ layer. Namely, it is possible to form a light emitting device of a double hetero structure that the single $ZnO_{1-x}S_x$ layer is sandwiched between clad layers of an n-type ZnO layer and a p-type ZnO layer. Similar to the quantum well structure, by performing annealing after the $ZnO_{1-x}S_x$ emission layer is formed, flatness of the emission layer is improved.

Next, a p-type ZnO layer 23 doped with N is formed on the emission layer 22. The p-type ZnO layer 23 is grown by applying a Zn beam, O radical beam and N radical beam at the same time to the substrate heated to 500° C. to 1000° C. A thickness of the p-type ZnO layer 23 is preferably 100 nm to 200 nm, and an N concentration is preferably $1\times10^{19}$ $cm^{-3}$. The P-type ZnO layer 23 uniformly doped with N is obtained.

Although n- and p-type ZnMgO layers may be used as clad layers, it is easier to manufacture n- and p-type ZnO layers as clad layers. It is difficult to form particularly a p-type ZnMgO layer.

Next, electrodes are formed. An n-side electrode 30 is formed on the bottom surface of the substrate 8. For example, the n-side electrode 30 is formed by forming a Ti layer having a thickness of 2 nm to 10 nm on the bottom surface of the substrate 8 and stacking an Al layer having a thickness of 300 nm to 500 nm on the Ti layer.

A p-side electrode 31 is formed on the upper surface of the p-type ZnO layer 23. For example, the p-side electrode 310 is formed by forming a Ni layer having a thickness of 0.5 nm to 1 nm on the p-type ZnO layer 23 and stacking an Au layer having a thickness of 10 nm on the Ni layer. A bonding electrode 32 is formed on the p-side electrode 31. For example, the bonding electrode 32 is made of an Au layer having a thickness of 500 nm.

After these electrodes are formed, an electrode alloying process is performed, for example, in an oxygen atmosphere at 400° C. to 800° C. An alloying process time is, for example, one minute to ten minutes. In this manner, the light emitting device of the seventh embodiment is manufactured. Although the ZnO substrate having n-type conductivity is used as the substrate 8, an SiC substrate and a GaN substrate having n-type conductivity may also be used.

Figure 10:
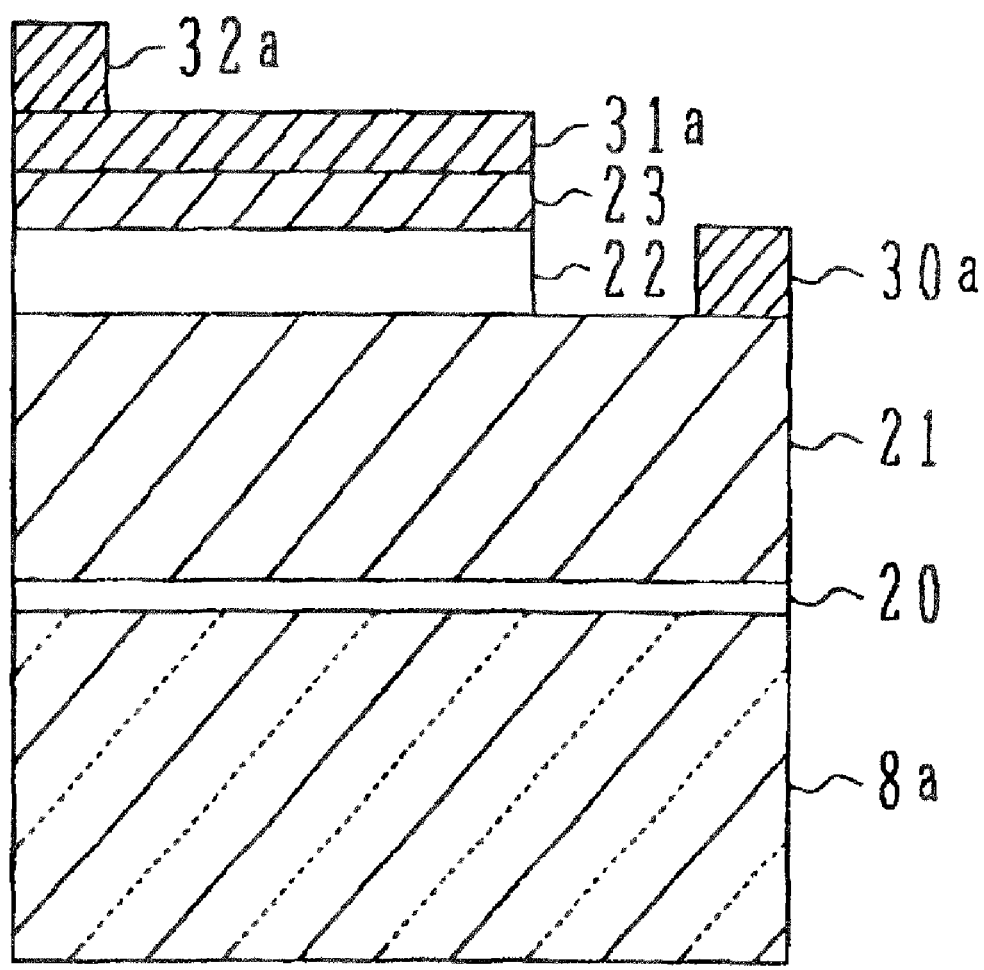
FIG. 10 is a schematic cross sectional view of a light emitting device of an eighth embodiment.

Next, with reference to FIG. 10, description will be made on a manufacture method for a light emitting device of the eighth embodiment. Different points from the seventh embodiment reside in that an insulating sapphire substrate 8a is used and therefore an electrode forming process is changed.

Similar to the seventh embodiment, layers from an n-type ZnO buffer layer 20 to a p-type ZnO layer 23 are formed on the substrate 8a. After the wafer formed with the layers up to the p-type ZnO layer 23 is dismounted from the film forming system, a resist film, a protective film or the like is formed on the p-type ZnO layer 23 and patterned to form an etching mask having a recessed window in a region corresponding to an area where an n-side electrode is to be formed. By using the etching mask, the p-type ZnO layer 23 and emission layer 22 are etched, for example, by wet etching or reactive etching to expose an n-type ZnO layer 21.

Next, for example, a Ti layer having a thickness of 2 nm to 10 nm is formed on the exposed n-type ZnO layer 21 and an Al layer having a thickness of 300 nm to 500 nm is stacked on the Ti layer to form an n-side electrode 30a. After the n-side electrode 30a is formed, the etching mask is removed.

Next, for example, an Ni layer having a thickness of 0.5 nm to 1 nm is formed on the surface of the p-type ZnO layer 23, and an Au layer having a thickness of 10 nm is stacked on the Ni layer to form a p-side electrode 31. Further, for example, a bonding electrode 32a made of an Au layer having a thickness of 500 nm is formed on the p-side electrode 31a. The p-side electrode 31a and bonding electrode 32a are formed by using a proper mask so as to prevent p-side electrode material from being laminated upon the n-side electrode 30a.

After these electrodes are formed, similar to the seventh embodiment, an electrode alloying process is performed, for example, in an oxygen atmosphere at 400° C. to 800° C. An alloying process time is, for example, one minute to ten minutes. In this manner, the light emitting device of the eighth embodiment is manufactured.

In the light emitting device of the eighth embodiment, the insulating sapphire substrate can be used. A ZnO substrate, an SiC substrate or a GaN substrate may also be used.

In the above-described embodiments, the c-plane ZnO substrate is used and the semiconductor device is formed on the + c-plane by way of example. The semiconductor device may be formed on the – c-plane. The semiconductor device may be formed also on the ZnO substrate having the a-plane or an m-plane.

As described above, setting $0.25<x<0.6$ in the structure that a $ZnO_{1-x}S_x$ layer is sandwiched between ZnO layers, carriers can be confined in the $ZnO_{1-x}S_x$ layer. It is therefore expected for example that a blue light emitting device having a high emission efficiency can be manufactured. By performing annealing at 500° C. or higher, and lower than 1000° C. after the $ZnO_{1-x}S_x$ layer is formed, flatness of the $ZnO_{1-x}S_x$ layer can be improved.

As studies have been made with reference to FIG. 4, the structure that the $ZnO_{1-x}S_x$ layer is sandwiched between $ZnO_{1-x}S_x$ layers can also confine carriers. This structure is also expected to be applied to the light emitting device.

Although MBE is used as a film forming method in the above-described embodiments, other film forming methods may also be used such as metal organic chemical vapor deposition (MOCVD) and pulse laser deposition (PLD). MBE and PLD are easier to control a film composition than MOCVD.

Although manufacturing a light emitting diode (LED) has been described above, a laser diode (LD) may also be manufactured by forming a cavity through cleavage. Products applying these light emitting devices may also be manufactured such as various indicators, light sources for displays and optical discs, and the like.

Further, a white LED may be formed by combining an LED with phosphorus for generating complementary color at a wavelength of LED. Products applying a white LED may also be manufactured such as illumination instruments, various indicators, back illumination for displays and various display units.

The present invention has been described above in connection with the embodiments. The present invention is not limited only to the embodiments. For example, it is apparent for those skilled in the art to make various modifications, improvements, combinations and the like.

What are claimed are:

1. A ZnO based semiconductor light emitting device comprising:
   a first semiconductor layer containing $ZnO_{1-x1}S_{x1}$;
   a second semiconductor layer formed above said first semiconductor layer and containing $ZnO_{1-x2}S_{x2}$; and
   a third semiconductor layer formed above said second semiconductor layer and containing $ZnO_{1-x3}S_{x3}$,
   wherein an S composition x1 of said first semiconductor layer, an S composition x2 of said second semiconductor layer and an S composition x3 of said third semiconductor layer are selected such that (i) an energy of said second semiconductor layer at the lower end of a conduction band becomes lower than both an energy of said first semiconductor layer at the lower end of a conduction band and an energy of said third semiconductor layer at the lower end of a conduction band, and (ii) an energy of said second semiconductor layer at the upper end of a valence band becomes higher than both an energy of said first semiconductor layer at the upper end of a valence band and an energy of said third semiconductor layer at the upper end of a valence band, and
   wherein the S composition x1 of said first semiconductor layer and the S composition x3 of said third semiconductor layer are 0, and the S composition x2 of said second semiconductor layer is in a range of $0.25<x2<0.6$.

2. The ZnO based semiconductor light emitting device according to claim 1, wherein an arithmetic average roughness Ra of a surface of said second semiconductor layer as measured with an atomic force microscope is 1.1 nm or smaller.

3. The ZnO based semiconductor light emitting device according to claim 1, further comprising an emission layer having a quantum well structure,
   wherein said first and third semiconductor layers comprise barrier layers, and said second semiconductor layer comprises a well layer in said emission layer.

4. The ZnO based semiconductor light emitting device according to claim 1, further comprising a double hetero structure,
   wherein said first semiconductor layer has a first conductivity type, said third semiconductor layer has a second conductivity type opposite to said first conductivity type, said first and third semiconductor layers comprise clad layers, and said second semiconductor layer comprises an emission layer.

5. The ZnO based semiconductor light emitting device according to claim 1, further comprising a ZnO substrate exposing a + c-plane,
wherein said first to third semiconductor layers are formed above the + c-plane of said ZnO substrate.

6. A manufacture method for the ZnO based semiconductor light emitting device according to claim 1, the method comprising:
(a) forming the first semiconductor layer containing $ZnO_{1-x1}S_{x1}$;
(b) forming the second semiconductor layer containing $ZnO_{1-x2}S_{x2}$ above said first semiconductor layer; and
(c) forming the third semiconductor layer containing $ZnO_{1-x3}S_{x3}$ above said second semiconductor layer.

7. The manufacture method according to claim 6, wherein said step (b) forms said second semiconductor layer at a temperature lower than 500° C.

8. The manufacture method according to claim 7, further comprising (d) annealing said second semiconductor layer formed at said step (b) at a temperature of 500° C. or higher, and lower than 1000° C.

9. The manufacture method according to claim 6, wherein said step (b) forms said second semiconductor layer by molecular beam epitaxy.

10. The manufacture method according to claim 6, further comprising (e) preparing a ZnO substrate exposing a + c-plane,
wherein said step (a) forms said first semiconductor layer above the + c-plane of said ZnO substrate.

* * * * *